(12) United States Patent
Venkata et al.

(10) Patent No.: US 6,963,223 B2
(45) Date of Patent: Nov. 8, 2005

(54) PROGRAMMABLE LOGIC DEVICES WITH MULTI-STANDARD BYTE SYNCHRONIZATION AND CHANNEL ALIGNMENT FOR COMMUNICATION

(75) Inventors: Ramanand Venkata, San Jose, CA (US); Chong H. Lee, San Ramon, CA (US); Rakesh Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/835,081

(22) Filed: Apr. 28, 2004

(65) Prior Publication Data

US 2005/0007996 A1   Jan. 13, 2005

Related U.S. Application Data

(63) Continuation of application No. 10/195,229, filed on Jul. 11, 2002, now Pat. No. 6,750,675.

(60) Provisional application No. 60/323,188, filed on Sep. 17, 2001.

(51) Int. Cl.[7] .......................................... H03K 19/177
(52) U.S. Cl. ............................. 326/41; 326/38; 326/47
(58) Field of Search ................................ 326/37–41, 47

(56) References Cited

U.S. PATENT DOCUMENTS

| 3,473,160 A | 10/1969 | Wahlstrom ................... 326/41 |
| 6,542,096 B2 | 4/2003 | Yap et al. ................... 341/100 |
| 6,650,140 B2 | 11/2003 | Lee et al. ...................... 326/39 |
| 6,894,530 B1 * | 5/2005 | Davidson et al. .............. 326/38 |
| 2001/0033188 A1 | 10/2001 | Aung et al. .................. 327/141 |
| 2005/0058186 A1 * | 3/2005 | Kryzak et al. .............. 375/219 |

OTHER PUBLICATIONS

"ORCA ORT82G5 1.0-1.25/2.0-2.5/3.125 Gbits/s Backplane Interface FPSC", Preliminary Data Sheet, Jul. 2001, Agere Systems Inc., pp. 1-35.
"ORCA ORT8850 Field-Programmable System Chip (FPSC) Eight Channel x 850 Mbits/s Backplane Transceiver", Product Brief, Jul. 2001, Agere Systems Inc., pp. 1-6.
"ORCA ORT8850 Field-Programmable System Chip (FPSC) Eight-Channel x 850 Mbits/s Backplane Transceiver", Data Sheet, Aug. 2001, Agere Systems Inc., pp. 1-36.

* cited by examiner

Primary Examiner—Anh Q. Tran
(74) Attorney, Agent, or Firm—Fish & Neave IP Group of Ropes & Gray LLP; Robert R. Jackson; Hong S. Lin

(57) ABSTRACT

A programmable logic device ("PLD") includes communication interface circuitry that can support any of a wide range of communication protocols, including Packet Over Sonet ("POS-5") and 8-bit/10-bit ("8B10B") protocols. The interface circuitry includes various functional blocks that are at least partly hard-wired to perform particular types of functions, but that in at least many cases are also partly programmable to allow the basic functions to be adapted for various protocols. Routing of signals to, from, between, and/or around the various functional blocks is also preferably at least partly programmable to facilitate combining the functional blocks in various ways to support various protocols.

10 Claims, 11 Drawing Sheets

PROGRAMMABLE LOGIC DEVICES WITH MULTI-STANDARD BYTE SYNCHRONIZATION AND CHANNEL ALIGNMENT FOR COMMUNICATION

CROSS-REFERENCE TO RELATED APPLICATIONS

This is a continuation of U.S. patent application Ser. No. 10/195,229, filed Jul. 11, 2002 is now a U.S. Pat. No. 6,750,675, which claims the benefit of provisional application No. 60/323,188, filed Sep. 17, 2001, which are hereby incorporated by reference herein in their entireties.

BACKGROUND OF THE INVENTION

A programmable logic device ("PLD") is typically designed to be usable in any of a wide range of possible applications. This allows the PLD to be manufactured in large quantities and sold to a large number of customers, each of whom may program it differently for a different use. Large volume production helps to reduce the unit cost of the PLD. Up to a point at least, the more possible uses the PLD can satisfy, the more customers will buy it for their individual needs and the larger the volume of production of the PLD can be, thereby lowering its unit cost further and further. Of course, too general a PLD may become excessively large and complex, thereby exerting cost-increasing pressure on the economics of the device. It is therefore necessary to strike a balance between too little and too much functionality in a PLD. The present invention relates to providing increased but not excessively increased functionality in a PLD.

PLDs are increasingly of interest for use in providing or at least supporting high speed communication. Among the communication protocols that it may be desirable to use PLDs with are several 8-bit/10-bit ("8B10B") protocols such as those known as XAUI, InfiniBand, Gigabit Ethernet, and the like, and non-8B10B protocols such as Packet Over Sonet or POS-5 and the like. These various protocols are industry standards, and so they do not need to be described in full detail here. They will already be familiar to those skilled in the art, or they can be learned from the publications of the industry groups that sponsor and maintain them. (Although these industry-standard protocols serve as a point of reference for this invention, the invention is not limited to these standards and can also implement many non-standard variations of these protocols.)

Although all the protocols mentioned above are different from one another in at least some respects, all of the 8B10B protocols have some general characteristics in common with one another that are quite different from the non-8B10B protocols (hereinafter generally referred to for convenience as POS-5 protocols; although, again, more than true industry-standard POS-5 is included in the term "POS-5" as used herein). For example, the 8B10B protocols tend to make use of relatively small numbers of serial data channels in parallel (e.g., up to four data channels), but allow relatively large amounts of skew (relative signal transmission delay) among those channels. At least some of the 8B10B protocols may allow skew of as much as several byte transmission times among the various channels. The POS-5 protocols, on the other hand, tend to make use of larger numbers of serial data channels in parallel (e.g., up to 16 data channels), but allow only relatively small amounts of skew among those channels. For example, POS-5 protocols may only allow skew of up to three high-speed clock intervals (i.e., three serial data bit intervals) among the channels.

Other related differences of a fundamental nature between 8B10B and POS-5 protocols include the provision in POS-5 of a separate de-skew reference channel and a separate reference clock signal channel, neither of which are part of 8B10B protocols, at least in their industry-standard forms.

These relatively fundamental differences in characteristics between 8B10B and POS-5 protocols make it difficult to envision circuitry that can support them both, especially with respect to such functions as byte synchronization and channel alignment. Byte synchronization relates to finding the boundaries between successive bytes in incoming serial bit streams. Channel alignment relates to determining the amount of, and then eliminating or at least compensating for, skew among the incoming data channels. For example, the amount of skew allowed in POS-5 protocols is so small that it can generally be taken care of as part of byte synchronization. That tends not to be true for 8B10B protocols, which typically require separate channel alignment circuitry in addition to byte synchronization circuitry.

On the other hand, it would not be as economical or efficient on a PLD to provide completely or largely separate circuitry for interfacing with each of these two classes of protocols.

SUMMARY OF THE INVENTION

In accordance with this invention a PLD has programmable logic circuitry and communication interface circuitry for supporting both 8B10B and POS-5 communication protocols. The interface circuitry facilitates use of the programmable logic circuitry to receive or transmit information via either 8B10B or POS-5 protocols. The interface circuitry includes a number of elements that are hard-wired to at least a large extent to perform various tasks required in the interface. Although these components are largely hard-wired to help speed them up, at least some of them are also partly programmable to enable them to operate differently in some respects to support different communication protocols. Among the components provided in the interface are byte synchronization circuitry and channel alignment circuitry. These elements are included in the circuitry where (if required) they can support both 8B10B and POS-5 protocols. The interface circuitry may include programmable signal routing for such purposes as effectively changing the location in the circuit of the byte synchronization circuitry and/or allowing the channel alignment circuitry to be either included in or excluded from the circuitry as required.

To facilitate supporting both 8B10B and POS-5 protocols, a PLD in accordance with this invention includes programmable logic circuitry and multiple channels of communication circuitry. At least some of the communication channels can be used as main data channels for receiving respective streams of serial data bits representing successive bytes of information as in either 8B10B or POS-5 communication. At least one of the communication channels is optionally usable to receive a further stream of serial data bits successively representing samples of the bytes approximately concurrently passing through the main data channels one after another, as in POS-5 communication. Each main data channel includes byte synchronization circuitry that is programmable to identify bytes in the associated data stream based on analysis of that stream (as in 8B10B communication), and that is alternatively programmable to identify bytes in the associated data stream based on byte identification performed in and by the reference data channel (as in POS-5 communication).

Another feature that a PLD may have in accordance with this invention is clock data recovery ("CDR") circuitry in the above-mentioned communication channels, phase locked loop ("PLL") circuitry for providing a reference clock signal for use by the CDR circuitry, and selection circuitry adapted to select a clock signal for use by the PLL circuitry from either a reference clock signal from the external source of the data applied to the communication channel (as in POS-5 communication), or from a source other than the external source (e.g., an oscillator more locally associated with the PLD, as in 8B10B communication).

Still another feature that a PLD may have in accordance with this invention is channel alignment circuitry in each of the above-mentioned main data channels. The channel alignment circuitry in each main channel is programmable to synchronize the data in that channel with data in other main channels based on comparison of data between the main data channels (as in 8B10B communication). Alternatively, the channel alignment circuitry in each main channel is programmable to synchronize the data in that channel with data in other main channels based on comparison of data between the main and reference data channels (as in POS-5 communication). In the latter case, the channel alignment may actually be performed by what is elsewhere referred to as byte synchronization circuitry in the main data channels.

Further features of the invention, its nature and various advantages, will be more apparent from the accompanying drawings and the following detailed description.

DETAILED DESCRIPTION

Interface circuitry capable of supporting a wide range of 8B10B communication protocols is shown in commonly assigned, co-pending, Lee et al. U.S. patent application Ser. No. 10/093,785, filed Mar. 6, 2002 (now U.S. Pat. No. 6,650,140), which is hereby incorporated by reference herein in its entirety. In certain of its aspects the present invention relates to adding to the circuitry shown in the Lee et al. disclosure capability to alternatively support various POS-5-type communication protocols. (As mentioned above, all such protocols that are generally like POS-5 are referred to herein simply as POS-5 protocols.) The circuitry shown herein makes use of many components that are either the same as or similar to components shown and described in the above-mentioned Lee et al. disclosure. Because those components are already fully described in the Lee et al. disclosure, it will not be necessary to repeat all of those details here. The same is true for the details of the 8B10B communication protocols that are fully described in the Lee et al. disclosure and that are again fully supported by the circuitry shown herein. Because those 8B10B protocols and the manner in which they are implemented are already fully described in the Lee et al. disclosure, corresponding aspects of the present discussion can be somewhat abbreviated.

Figure 1:
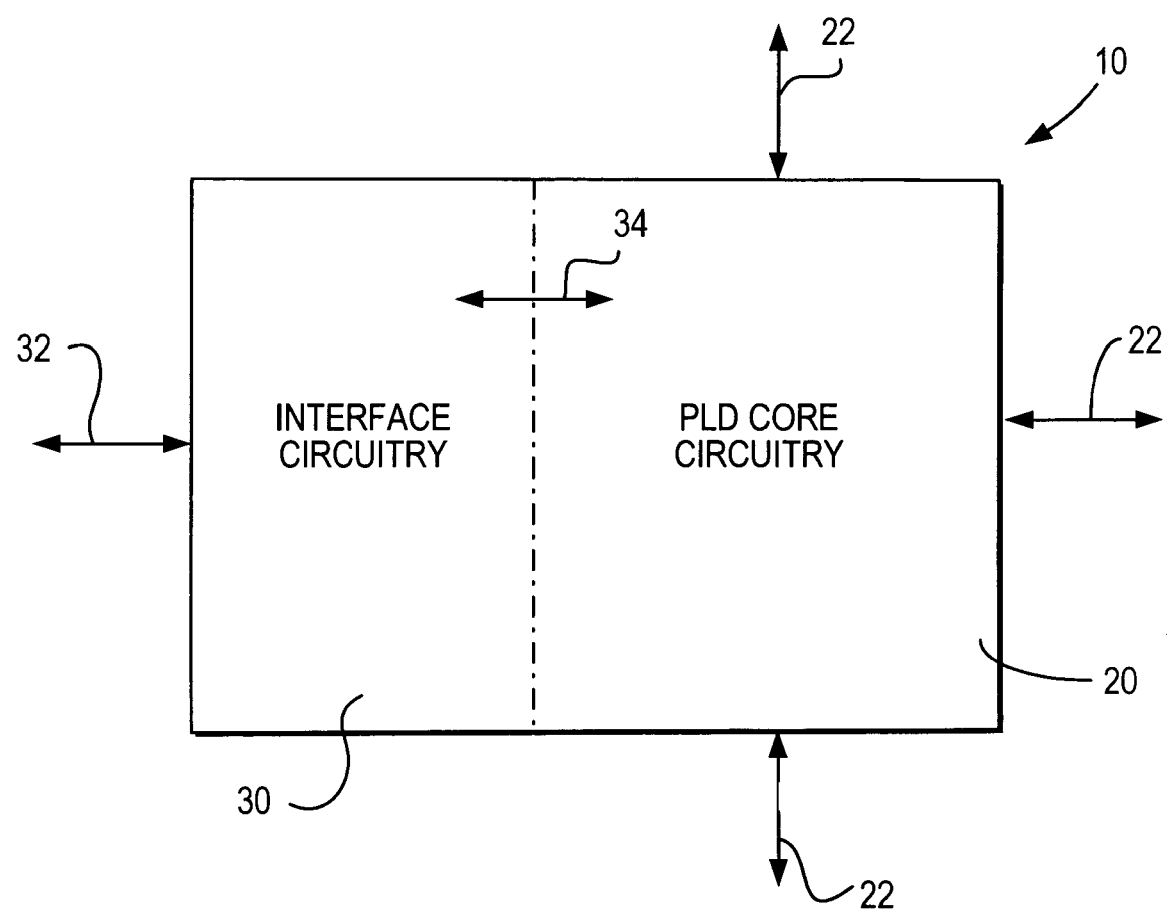
FIG. 1 is a simplified block diagram of an illustrative embodiment of a PLD constructed in accordance with the invention.

An illustrative PLD 10 constructed in accordance with this invention is shown in FIG. 1. PLD 10 is an integrated circuit that includes PLD core circuitry 20 and high-speed serial communication interface circuitry 30. PLD core circuitry 20 can be typical programmable logic circuitry of any of several known types and constructions. Interface circuitry 30 includes various circuit components that are hard-wired (at least to a large extent) and are therefore dedicated to performing various functions required to implement any of several 8B10B and/or POS-5 communication protocols. Interface circuitry 30 may be used to receive several high-speed serial communication signals via connections 32 and to pass the information thus received on to PLD core circuitry 20 in a form that is more readily usable by the core circuitry. Alternatively or additionally, circuitry 30 may be used to output via connections 32 several high-speed serial communication signals indicative of information received from PLD core circuitry 20. Leads 34 are used to convey signals between PLD core circuitry 20 and interface circuitry 30. PLD core circuitry 20 may also input and/or output other signals via leads 22.

The communication protocols supported by interface circuitry 30 include various 8B10B protocols and various POS-5 protocols. The 8B10B protocols have been discussed in the above-mentioned Lee et al. disclosure and therefore do not need to be discussed again here in full detail. Instead, only salient aspects of POS-5 protocols will be reviewed in the next few paragraphs.

The POS-5 communication standard embraces a number of variations. As just some examples, the number of channels over which data is transmitted in parallel can be varied, and the data can be either scrambled or unscrambled. (SFI-5 is the designation used for unscrambled data; SPI-5 is the designation used for scrambled data.) Because the apparatus of this invention (including interface circuitry 30) is preferably at least partly programmable, this apparatus can preferably support many such POS-5 variants (just as it can support many different 8B10B communication protocols). The apparatus of this invention can also typically support many communication protocols that are generally like POS-5 but that are outside the range of variation typically contemplated for industry-standard POS-5. As has been said, all such generally POS-5-like protocols will be referred to for convenience herein simply as POS-5 protocols.

Figure 2:
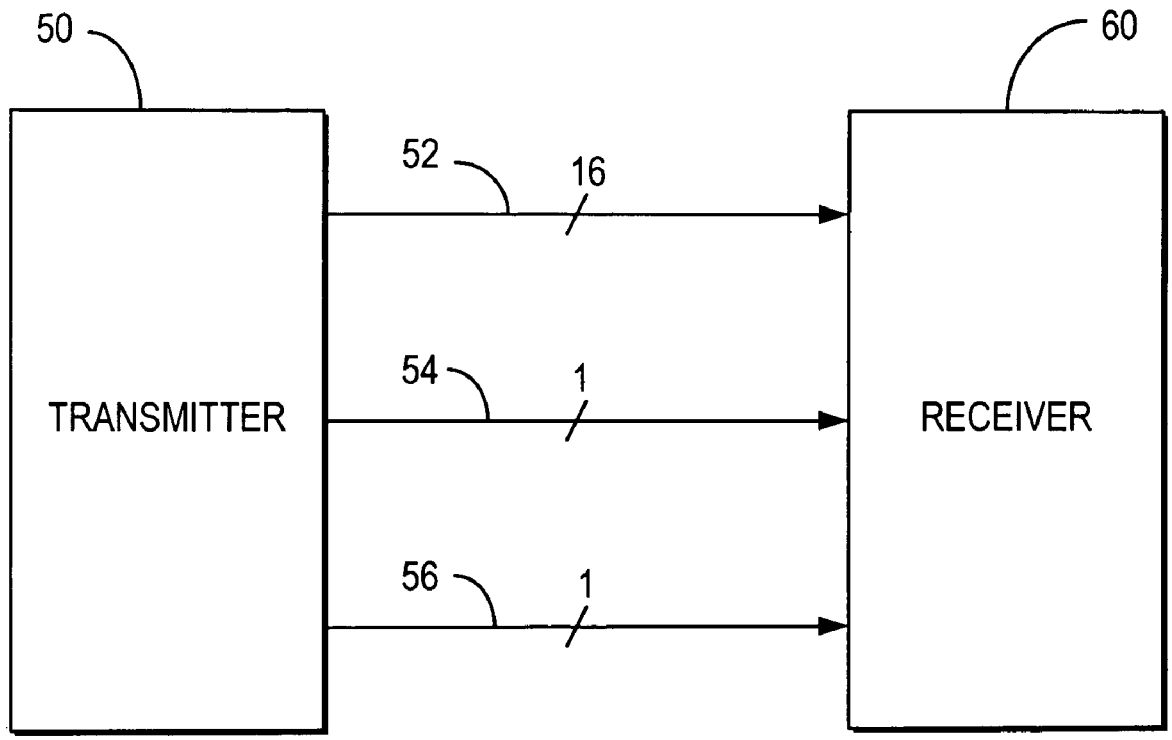
FIG. 2 is a simplified block diagram of a prior art network using POS-5 communication.

FIG. 2 shows a typical system 40 employing POS-5 communication. System 40 includes transmitter circuitry 50 and receiver circuitry 60. Up to 16 parallel leads 52 are used to transmit data from transmitter 50 to receiver 60. Leads 52 are used to transmit successive bytes of data in a repeating, "round-robin" pattern. Assuming that leads 52 are numbered 0–15, and that successive bytes of data are numbered 0–n, then byte 0 is transmitted via lead 0, byte 1 is transmitted via lead 1, and so on until byte 15 is transmitted via lead 15. Then byte 16 is transmitted via lead 0, byte 17 is transmitted via lead 1, and so on until byte 31 is transmitted via lead 15. This pattern of use of leads 52 continues indefinitely.

Lead 54 is a so-called de-skew reference channel. Because the data transmission rate is potentially so high, different amounts of signal delay associated with respective different ones of leads 52 may cause receiver 60 to receive the signals on the various leads 52 shifted in time relative to one another and therefore no longer properly synchronized (or aligned in time) with one another. Such "skew" in the received data means that reassembling the received bytes in their original order can be somewhat complicated. To facilitate de-skewing the received data, the same data that is being sent on each of leads 52 is also sent for a short time on lead 54. Each of leads 52 takes a turn using lead 54 in this way. Receiver 60 determines the time delay between the receipt of data on each of leads 52 and lead 54. This enables receiver 60 to determine the amount of skew between the various leads 52.

Lead 56 is used by transmitter 50 to send a reference clock signal to receiver 60. This avoids the need for "rate matching" to account for possible differences in frequency between different clocks used by elements 50 and 60.

PLD 10 in FIG. 1 can be used for either transmitter 50 or receiver 60 in FIG. 2. In either case, leads 32 in FIG. 1 collectively represent leads 52, 54, and 56 in FIG. 2. Although FIG. 2 suggests that element 50 is only a transmitter and element 60 is only a receiver, each of these elements may alternatively be a transmitter/receiver, with additional connections similar to 52, 54, and 56 running in the opposite direction for communication from element 60 to element 50. Again, if PLD 10 in FIG. 1 is used for either of these transmitter/receiver elements, then leads 32 collectively represent all of these connections between elements 50 and 60.

Figure 3:
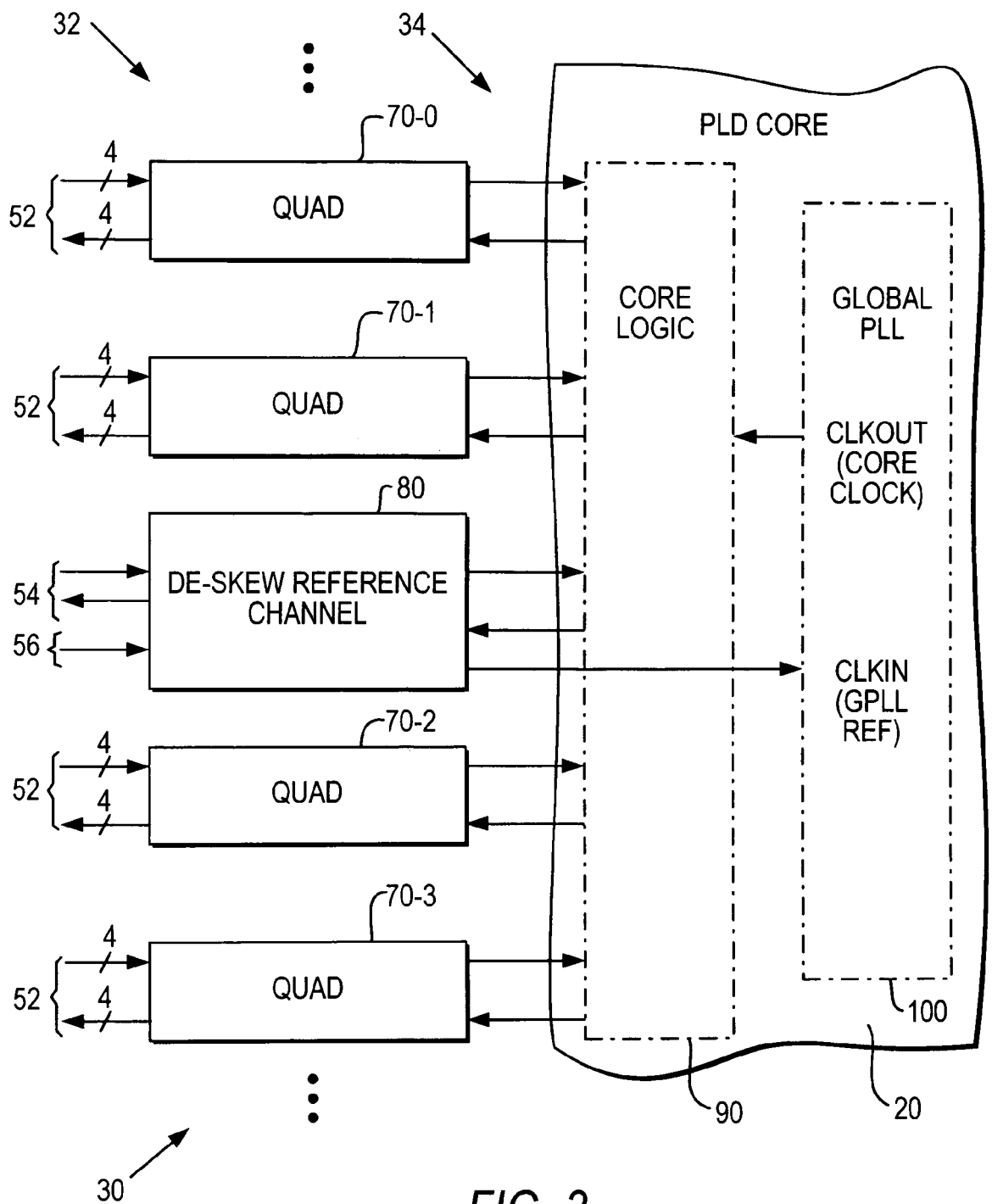
FIG. 3 is a block diagram showing representative portions of FIG. 1 in more detail.
Figure 4:
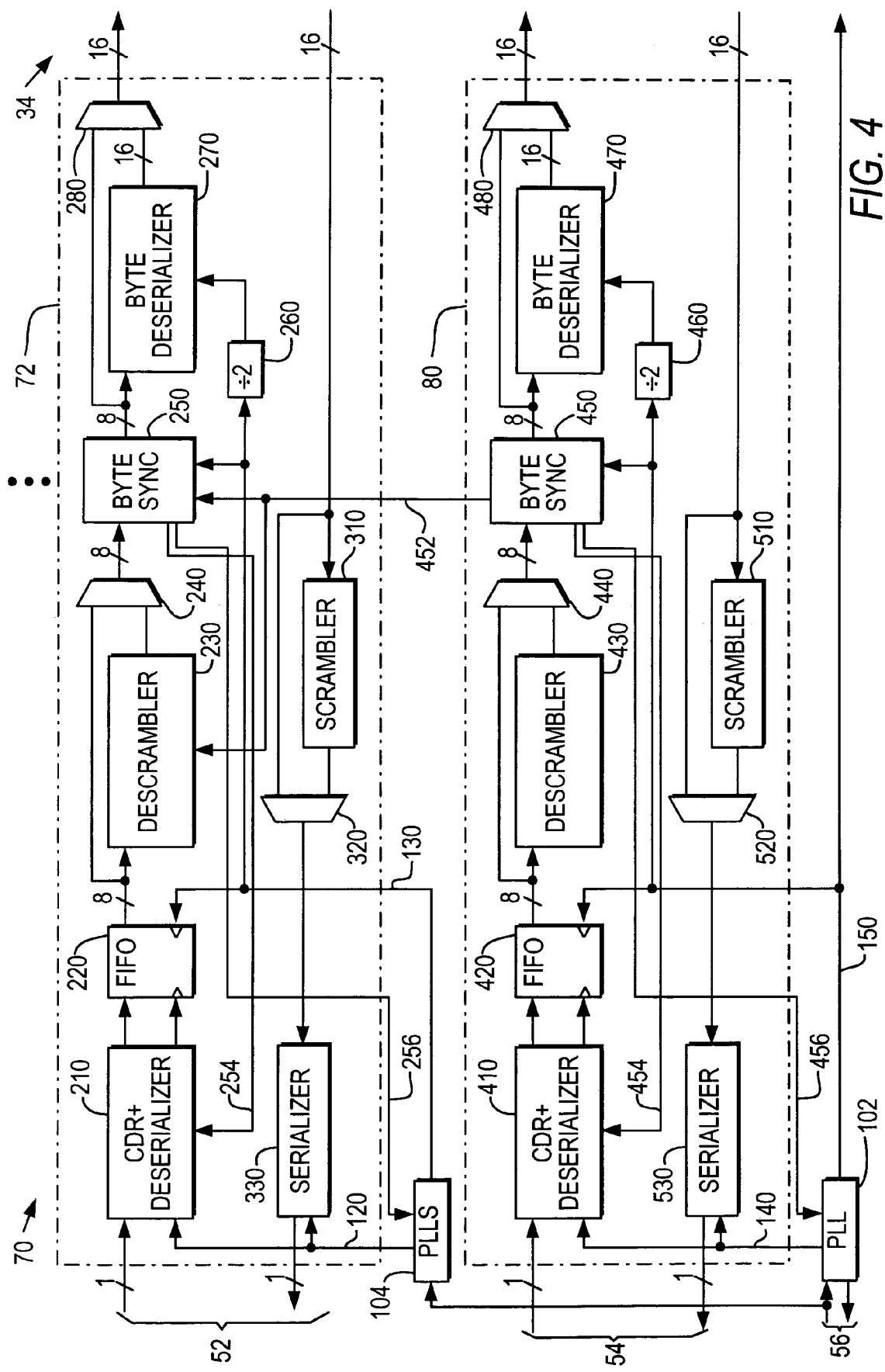
FIG. 4 is a schematic block diagram showing representative portions of FIG. 3 in still more detail.

FIGS. 3 and 4 show an illustrative embodiment of how the circuitry of FIG. 1 (especially interface circuitry 30) can be organized and used (at least in part) to support POS-5 communication. Later it will be shown that the circuitry of FIGS. 3 and 4 is preferably only part of interface 30 circuitry, and how additional elements are preferably included in that circuitry to enable it to support either POS-5 or 8B10B communication (or even both at the same time, if sufficient numbers of channels are included).

FIG. 3 shows an illustrative embodiment of representative portions of the FIG. 1 circuitry in somewhat more detail. FIG. 3 shows that to support one POS-5 gateway (including 16 data channels 52, one de-skew reference channel 54, and a reference clock channel 56), a representative portion of interface circuitry 30 is organized into four "quads" 70-0 through 70-3 and one de-skew reference channel 80. Each quad 70 includes four main data channels. Quads 70 are shown as fully bi-directional (i.e., able to function as receiver and/or transmitter circuitry). De-skew reference channel 80 is shown as bi-directional with respect to de-skew reference signals 54. But channel 80 is shown only receiving an external reference clock signal 56. More will be said later about how circuitry of the type shown in FIG. 3 can be a reference clock signal source.

As shown in FIG. 3 each of quads 70 and de-skew reference channel 80 communicates with core logic 90 via leads 34. The principal information thus communicated is data. This data may be data that circuitry 70/80 has recovered from incoming leads 52/54. Or this data may be data that core logic 90 wants to output via circuitry 70/80 and outgoing leads 52/54. As still another possibility, both of these directions of data flow may be used. In addition, various control signals may pass via leads 34 in either or both directions between elements 70 and 80, on the one hand, and core logic 90, on the other hand. For example, these control signals may include "start", "stop", and other flag signals, as well as clock signals. A reference clock signal 56 received via channel 80 may be applied to phase locked loop ("PLL") circuitry 100. From this reference clock signal, PLL circuitry 100 may produce one or more further clock signals for use by core logic 90 and also at least portions of circuitry 70/80.

Although not shown in FIG. 3 to avoid over-crowding that drawing, it will be apparent from later discussion that de-skew reference channel 80 is also a source of signals applied to quads 70 for use by the quads to de-skew and/or byte synchronize the data signals they are receiving via leads 52.

FIG. 4 shows an illustrative embodiment of representative portions of the FIG. 3 circuitry in more detail. In particular, FIG. 4 shows one representative data channel 72 in one representative quad 70. FIG. 4 also shows de-skew reference channel 80. And FIG. 4 shows some of the PLL circuitry 102 and 104 from PLL circuitry 100 in FIG. 3.

Considering, first, representative data channel 72, this circuitry includes a receiver portion (the elements with reference numbers in the 200 series) and a transmitter portion (the elements with reference numbers in the 300 series). The receiver portion of channel 72 begins with clock data recovery ("CDR") and deserializer circuitry 210. An illustrative example of circuitry of this kind is shown and described in more detail in Aung et al. U.S. patent application Ser. No. 09/805,843, filed Mar. 13, 2001.

Circuitry 210 performs two basic functions. First, it recovers serial data from the serial input signal received via incoming lead 52. To do this, circuitry 210 may use one or more clock signals from a PLL 104 that receives the incoming reference clock signal 56. Although the phase of this reference clock signal 56 may be skewed relative to the phase of the data on incoming data lead 52, the frequencies of these two signals will always have a known relationship to one another (e.g., these frequencies may be the same or related to one another by an integer multiplier or divider factor). PLL 104 locks onto reference clock signal 56 and produces one or more related clock signals 120 that help circuitry 210 recover the data from incoming data signal 52. (Signals 120 typically have frequency at the bit rate of the incoming data.) An advantage of this arrangement is that it allows the circuitry to operate at any frequency in a wide range of possible frequencies. This is particularly desirable in the context of circuitry on a PLD that is intended to be able to support any of a wide range of possible uses, including any of a wide range of communication protocols.

The second function performed by circuitry 210 is to deserialize the recovered serial data. For example, if the basic structure of the data is 8-bit bytes, circuitry 210 accumulates eight successive bits of recovered data and outputs them in parallel. It will be explained later how the boundaries between bytes are found.

The next element in the receiver circuitry in channel 72 is first-in/first-out ("FIFO") memory circuitry 220. FIFO 220 stores successive bytes output by circuitry 210 in synchronism with the production of bytes by that circuitry. FIFO 220 allows these bytes to be read out with different phasing, if that is necessary. In other words, the write clock applied to the left side of FIFO 220 (i.e., a recovered clock signal from circuitry 210 having frequency at the byte rate of the incoming data) can have phase different from the read clock 130 applied to the right side of the FIFO. (Signal 130 is another signal having frequency at the byte rate of the incoming data.) The data read out from FIFO 220 is applied to descrambler circuitry 230. If used, circuitry 230 performs the algorithm required to descramble the data and applies the resulting descrambled data to the lower inputs of programmable logic connector ("PLC") 240. Descrambler 230 may require one or more control signals from byte synchronization circuitry 450, described later. If descrambling is not needed (e.g., for SFI-5 data (as opposed to SPI-5 data, for which descrambling is needed)), then descrambler 230 can be bypassed via the leads connected to the upper inputs to PLC 240. PLC 240 is typically controlled by programmable function control elements ("FCEs"; not shown separately in FIG. 4) to select either of its two sets of input terminals as the source of its output signals.

The output signals of PLC 240 are applied to byte synchronization circuitry 250. Circuitry 250 works with byte synchronization circuitry 450 in de-skew reference channel 80 when channel 80 is receiving the same data as channel 72. When both of these channels are thus receiving the same data, circuitry 450 looks for special characters or special bit sequences in the received data. These special characters or bit sequences allow circuitry 450 to locate byte boundaries in the data it receives. Thereafter circuitry 450 can output via the leads 452 that extend to channel 72 signals indicative of properly bounded bytes. Circuitry 250 can then search the data it is receiving from PLC 240 for the same bytes. When circuitry 250 finds the corresponding data, it knows both where the byte boundaries are in the data it is receiving from PLC 240 and how much that data must be shifted in time so that this data will not be skewed relative to the data being output by all the other channels 72 served by channel 80.

Circuitry 250 may produce output signals 254 that are applied to circuitry 210 to enable circuitry 210 to lock onto the proper byte boundaries in the incoming data. For example, the deserializer portion of circuitry 210 may be controlled in response to signals 254 to try different serial-to-parallel registrations until the proper one is found. Any skew that remains after this has been done may be removed by circuitry 250. For example, circuitry 250 may produce output signals 256 for changing the phase of output signal 130 of PLL 104 so that FIFO 220 is read in synchronism (no skew) with the corresponding FIFOs in all of the data channels served by channel 80. This will mean that all of elements 230, 240, 250, 260, 270, and 280 in all the data channels served by channel 80 will operate in synchronism so that PLD 20 receives data from all data channels without any skew. Removal of skew is also sometimes referred to a channel alignment.

As has been mentioned, descrambler 230 may also receive one or more control signals 452 from circuitry 450. For example, descrambler 230 may need to be turned off or periodically reset during the above-described byte synchronization and channel alignment operations.

The de-skewed and channel-aligned data output signals of circuitry 250 are applied both to the upper set of input terminals of PLC 280 and to byte deserializer circuitry 270. Circuitry 250 may be outputting bytes of data faster than PLD core 20 can conveniently receive them. In that event, byte deserializer circuitry 270 can be used to deserialize successive pairs of bytes and to output in parallel both bytes in each such pair. To do this, circuitry 270 uses circuitry 260 to divide in half the frequency of the byte-rate clock signal 130 output by PLL 104 and used by upstream elements such as 220 and 250. The two-byte-wide output signals of circuitry 270 are applied to the lower set of input terminals of PLC 280. PLC 280 is controlled (typically by FCEs that are not shown separately) to select either of its sets of inputs as the source of its outputs. The outputs of PLC 280 are applied to PLD core 20.

Turning now to the transmitter portion of representative data channel 72, that circuitry is shown as capable of receiving from PLD core 20 up to two 8-bit bytes of data in parallel. It will be understood, however, that it is not necessary to use this full output bus width in all cases if that is not desired. For example, if PLD core 20 can output bytes successively at the desired data output rate, then only eight of the 16 available output leads may be used.

The output data received by channel 72 is applied to both the upper set of inputs of PLC 320 and to scrambler circuitry 310. If used, circuitry 310 performs the functions required to scramble the data being output. The scrambled data output signals of circuitry 310 are applied to the lower set of inputs to PLC 320. PLC 320 (typically programmably controlled by FCEs that are not shown separately) selects either of its sets of input signals as the source of its output signals. Thus PLC 320 allows scrambler 310 to be bypassed if it is not needed.

The output signals of PLC 320 are applied to serializer circuitry 330. This circuitry converts the applied parallel data to serial form for output via the associated lead 52. To do this, circuitry 330 may make use of a bit-rate output signal 120 of PLL 104. Illustrative circuitry that can be used for serializer 330 is shown in the above-mentioned Aung et al. disclosure.

Considering now de-skew reference channel 80, the various components used in that channel can be the same as or similar to elements used in representative data channel 72 and already described above. In particular, each element in channel 80 that is at least similar to an element in channel 72 has a reference number that is increased by 200 from the reference number of the corresponding element in channel 72. Thus, for example, element 410 in channel 80 can be the same as element 210 in channel 72. Channel 80 gets its bit-rate (140) and byte-rate (150) clocks from PLL circuitry 102, which may be similar to PLLs 104, but which may additionally supply a clock signal for use by PLD core 20 and/or a signal for output as a reference clock signal 56.

All of the elements in channel 80 perform the same functions as the corresponding elements in channel 72. Accordingly, it will not be necessary to again describe these elements in full detail. The only element in channel 80 that may be somewhat different from the corresponding element in channel 72 is byte synchronization circuitry 450, but to the extent that it is different from byte synchronization circuitry 250, circuitry 450 has already been described.

The ability of the FIG. 4 circuitry to support various POS-5 communication protocols will already be apparent to at least some extent from FIG. 4 and its description thus far. For example, CDR circuitry 210 supports a wide range of signalling frequencies. The circuitry is programmable (via PLCs 240/320 etc.) to support either scrambled or unscrambled communication. The circuitry is programmable (via PLCs 280/480) to output to PLD core 20 either bytes one after another or bytes in parallel pairs. Still other respects in which the FIG. 4 circuitry may be variable are described below.

Figure 5:
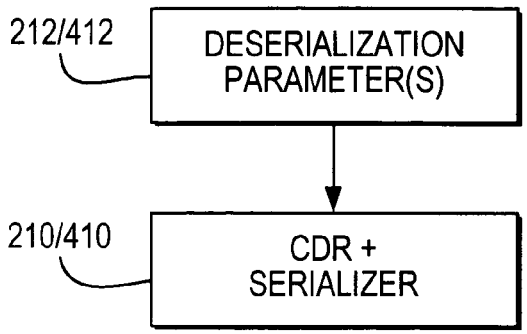
FIG. 5 is a block diagram showing more detail about how certain elements in FIG. 4 may be constructed.

FIG. 5 shows that CDR and serializer circuitry 210/410 may be augmented with programmable memory or register circuitry 212/412 for storing one or more programmable parameters for use in controlling at least some aspects of the operation of circuitry 210/410. An example of such a programmable parameter may be a byte length parameter used by circuitry 210/410 to control how many successive incoming serial bits to assemble into a parallel output byte. The illustrative embodiments described for the most part herein assume that this parameter is 8, but other values such as 4 or 6 are also possible.

Figure 6:
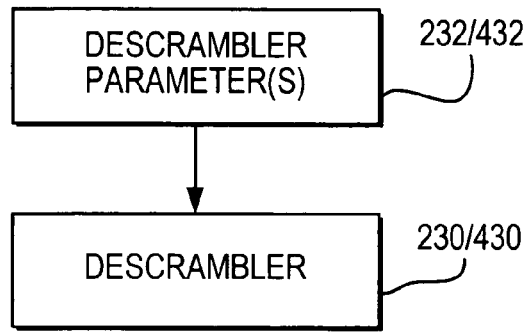
FIGS. 6–9 are similar to FIG. 5 for other elements in FIG. 4.

FIG. 6 shows that scrambler circuitry 230/430 may be augmented with programmable memory or register circuitry 232/432 for storing one or more programmable parameters for use in controlling at least some aspects of the operation of circuitry 230/430. For example, the descrambling algorithm and/or parameter values used in the descrambling algorithm may be programmed into memory circuitry 232/432 so that the circuitry can use any of several different descrambling algorithms or descrambling parameter sets.

Figure 7:
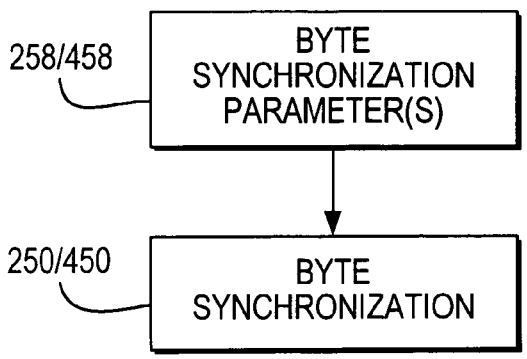

FIG. 7 shows that byte synchronization circuitry 258/458 may be augmented with programmable memory or register circuitry 258/458 for storing one or more programmable parameters for use in controlling at least some aspects of the operation of circuitry 250/450. For example, memory circuitry 258/458 may store the special characters or bit sequences that circuitry 250/450 will use in the process of locating byte boundaries in incoming data. Accordingly, the apparatus may be programmable to operate with any of a wide range of special characters or bit sequences for byte registration. As another example of the respects in which circuitry 250/450 may be programmably controlled by circuitry 258/458, the latter circuitry may control circuitry 250/450 to operate either as described above for POS-5 communication, or to operate as described elsewhere for 8B10B communication. For example, in the latter case, circuitry 250 may perform byte synchronization for the associated channel based on analysis of the data passing through that channel and without reference to data in any other channel such as de-skew reference channel 80.

Figure 8:
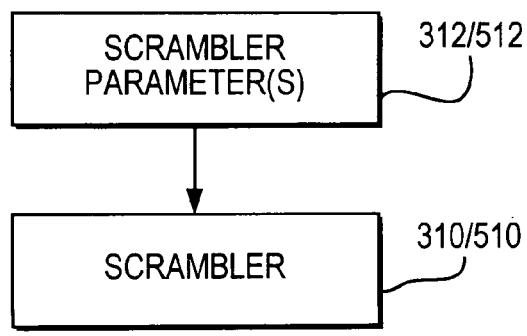

FIG. 8 is similar to FIG. 6, but for scrambler circuitry 310/510 rather than for descrambler circuitry 230/430. Thus memory circuitry 312/512 may store the programmable scrambler algorithm and/or programmable scrambler parameters that circuitry 310/510 will use in scrambling outgoing data. This again makes the circuitry programmable with respect to the scrambling algorithm and/or scrambling parameters that will be used.

Figure 9:
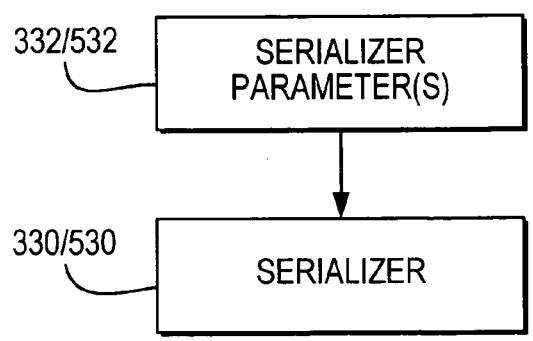

FIG. 9 is similar to FIG. 5, but for serializer circuitry 330/530 rather than for deserializer circuitry 210/410. Thus memory circuitry 332/532 may store the programmable serializer parameter(s) that circuitry 330/530 will use in converting outgoing bytes of parallel bits to serial bits. For example, such a programmable parameter may specify the byte length, thereby allowing any of several different programmably selectable byte lengths to be used.

Figure 10A:
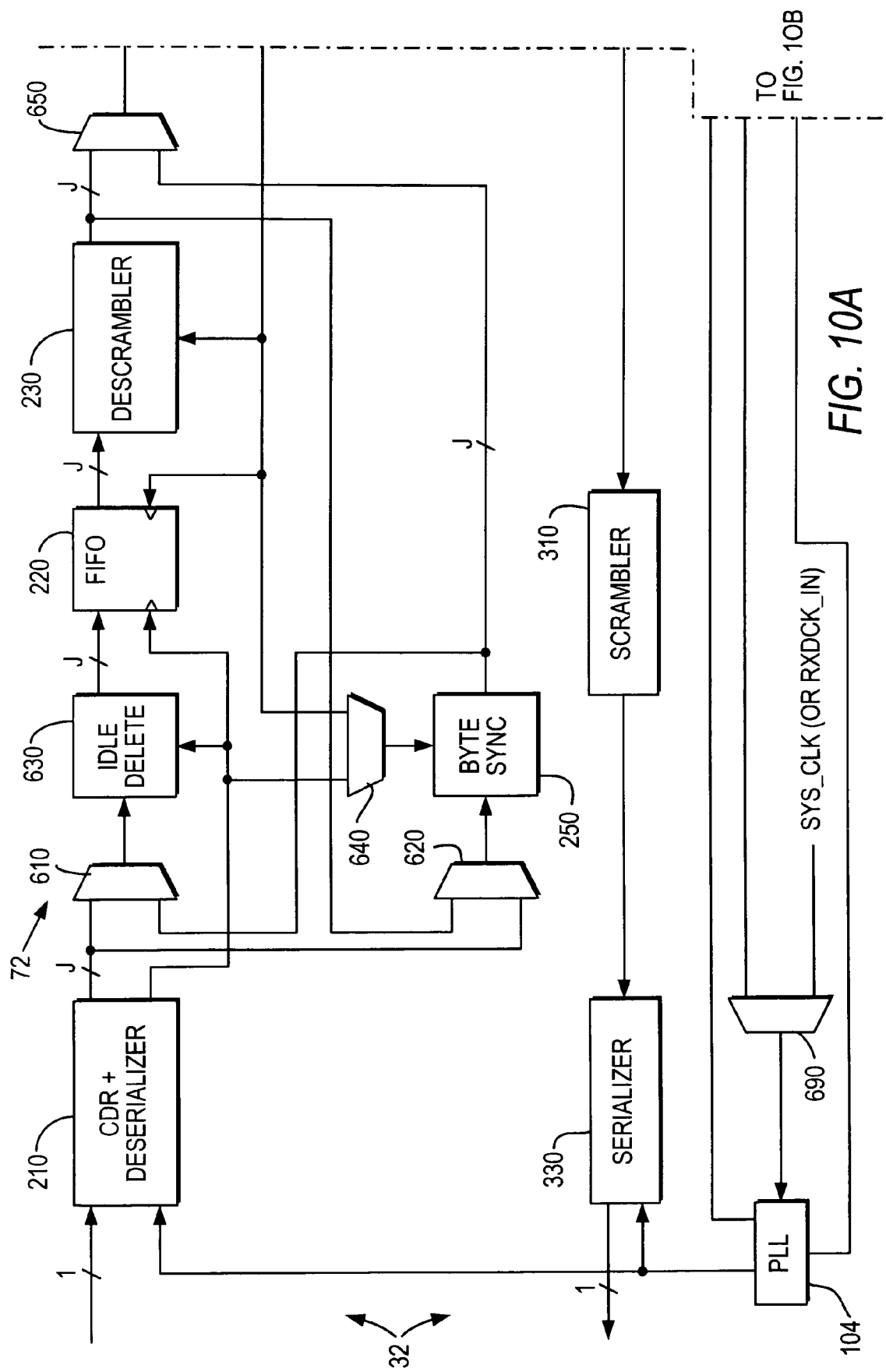
FIGS. 10A and 10B are collectively a simplified schematic block diagram showing an illustrative embodiment of circuitry of the type shown in FIG. 4 with additional elements for providing other capabilities in accordance with the invention.
Figure 10B:
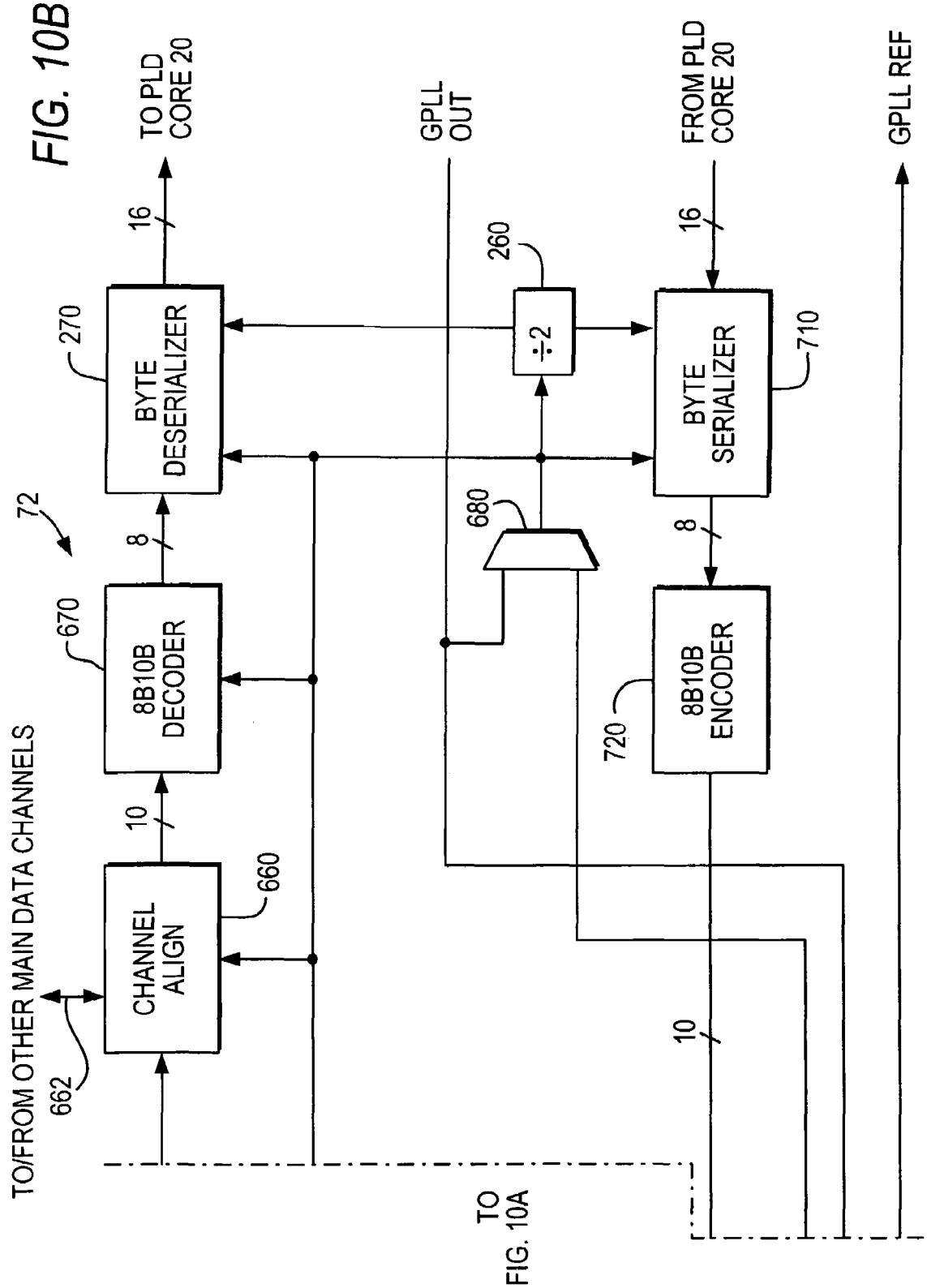
Figure 11:
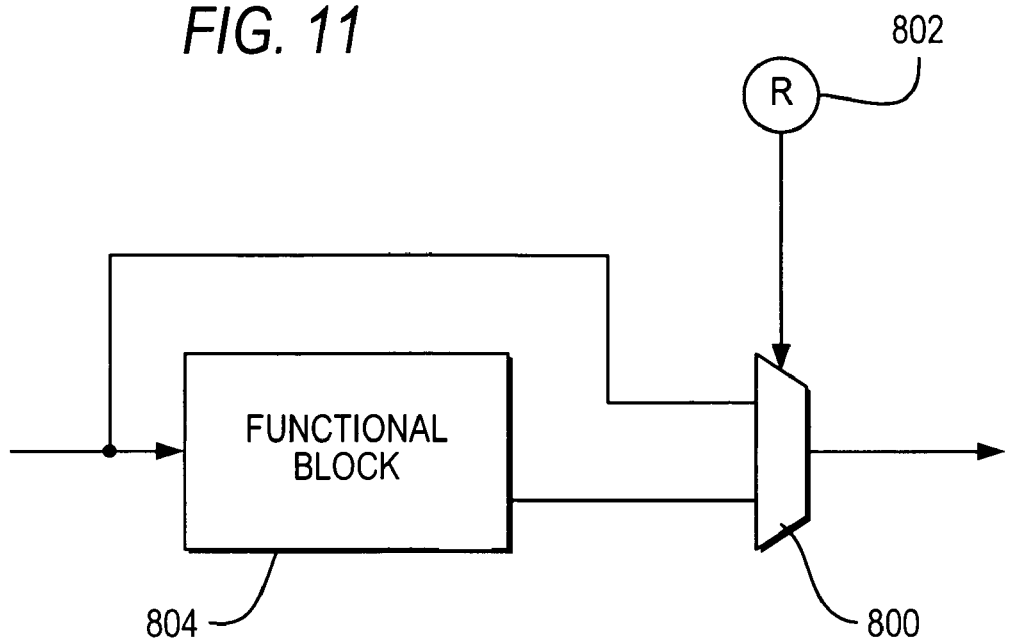
FIG. 11 is a simplified schematic block diagram showing a type of additional circuit arrangement that can be included at any of several points in the circuitry of FIGS. 10A and 10B (or 13A and 13B) in accordance with the invention.

As has been mentioned, FIG. 4 shows only the subset of the elements in interface circuitry 30 (FIG. 1) that are used to support POS-5 communication protocols. FIGS. 10A and 10B collectively show an illustrative embodiment of a representative data channel 72 with all the elements from FIG. 4 for supporting POS-5 communication, plus additional elements for alternatively supporting 8B10B communication. To avoid over-crowding the drawing, FIGS. 10A and 10B do not show circuitry that is provided for optionally, programmably bypassing each of most of the elements in the circuitry. A generic, illustrative form of such bypass circuitry is shown in FIG. 11 and includes PLC 800 controlled by programmable FCE 802 for allowing generic functional block circuitry 804 to be either used or bypassed, as desired. Examples of this type of bypass circuitry in FIG. 4 include elements 240, 280, and 320. Although not shown in FIGS. 10A and 10B, it will be understood that such bypass circuitry is again present for elements 230, 270, and 310, and that similar bypass circuitry is also preferably provided for other elements such as 630, 660, 670, 710, and 720. For example, use of this bypass circuitry is part of what allows the circuitry of FIGS. 10A and 10B to be configured as shown in FIG. 4 when POS-5 rather than 8B10B communication is to be implemented.

In FIGS. 10A and 10B and elsewhere, the parameter J is used to indicate buses that may have any of several widths.

The following further discussion of FIGS. 10A and 10B can be somewhat abbreviated because (as was mentioned earlier) the elements that are added (as compared to FIG. 4) can be like elements in the above-mentioned Lee et al. disclosure.

To briefly describe the added elements, idle delete circuitry 630 deletes specially designated characters periodically to prevent FIFO overrun in the event of mismatch between the clock used in the source of the data being received by channel 72 and the clock used by the PLD that includes channel 72. (In POS-5 communication the use of a reference clock link 56 between the transmitter and receiver eliminates the need for this type of rate matching circuitry and associated elements for periodic character deletion (or its possible converse, character insertion).) Channel alignment circuitry 660 is provided to take care of the greater skew permitted by 8B10B communication protocols (as compared to the much less skew permitted by POS-5 protocols). 8B10B decoder circuitry is provided for converting the 10-bit "bytes" (used by 8B10B protocols for data transmission) to conventional 8-bit bytes. PLC 680 (programmably controlled by an FCE that is not shown separately) allows divide-by-two circuitry 260 and many other elements such as 250 (via PLC 640), 220, 230, 660, 670, 270, and 710 to receive a clock input signal from either a clock signal ("GPLL OUT") driven by an oscillator associated with the PLD 10 that includes the receiver channel being described, or a clock signal from PLL 104 (FIG. 10A), which may receive its clock from an incoming reference clock signal. The GPLL OUT signal is typically used in 8B10B mode. The incoming reference clock signal is typically used in POS-5 mode.

Turning now to the added elements in the transmitter portion of the circuitry shown in FIGS. 10A and 10B, byte serializer 710 is added as compared to FIG. 4 because in 8B10B mode the transmitter circuitry may need to serialize two bytes received in parallel from PLD core 20 so that 8B10B encoder 720 can operate on those two bytes one after another. In 8B10B mode encoder 720 converts each successive 8-bit byte to the 10-bit form used in 8B10B signal transmission. PLC 690 allows PLL 104 to get its clock input from an oscillator associated with the PLD 10 that includes the circuitry being described or from an incoming reference clock signal. Again, the more local clock is typically used in 8B10B mode, while the incoming reference clock signal is typically used in POS-5 mode.

Returning now to elements 610, 620, 640, and 650 in the receiver portion of the circuitry shown in FIGS. 10A and 10B, these elements help route signals to the various receiver circuit elements in various ways that are appropriate to the particular communication protocol being used. For example, for 8B10B signalling, the routing of data is typically from circuitry 210 through PLC 620 to byte synchronization circuitry 250. Then from circuitry 250, the data goes to circuitry 630 via PLC 610. For POS-5 signalling, on the other hand, the data typically does not go to byte synchronization circuitry 250 until after passing through FIFO 220 and (if used) descrambler 230. Thus the other condition of PLC 620 is used in POS-5 mode to route data from circuitry 220/230 to circuitry 250. Then PLC 650 is used to pass the output signals of circuitry 250 on to downstream elements. PLC 640 allows byte synchronization circuitry 250 to operate on either a recovered clock signal from circuitry 210 (typical for 8B10B mode) or on a clock signal which can be derived from an incoming reference clock signal (typical for POS-5 mode).

Figure 12:
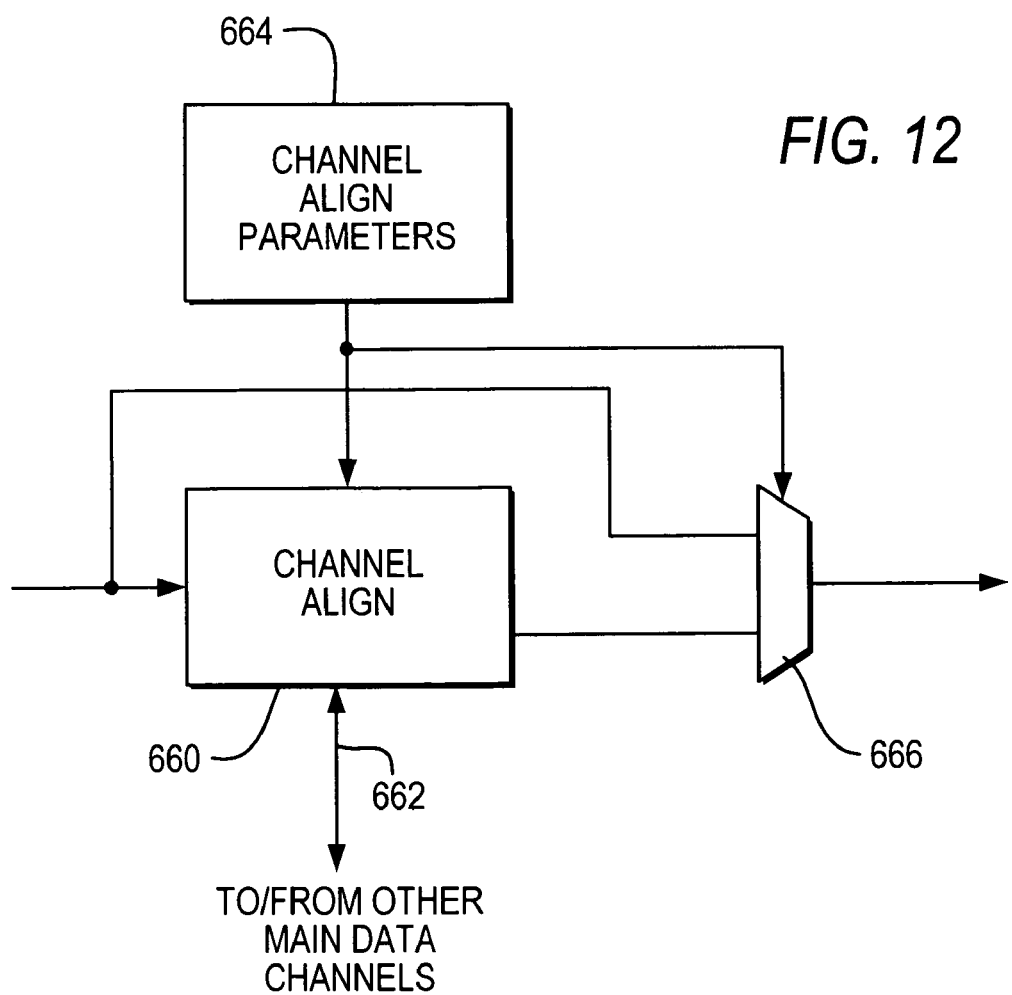
FIG. 12 is again similar to FIG. 5, but for an element in FIG. 10B (or 13B).

A final point to make with reference to channel alignment circuitry 660 is as follows. As has been said, this circuitry is typically needed primarily for 8B10B communication protocols. In such protocols, channel alignment may be based on comparing signals passing through the various main data channels to be aligned. Thus leads 662 are shown in FIG. 10B for allowing the channel align circuitry 660 in each main data channel to exchange skew and alignment information with the channel align circuitry 660 in other main data channels that are to be synchronized (aligned) with one another. FIG. 12 shows specifically that channel align circuitry 660 may have associated programmable memory or register circuitry 664 for storing one or more programmable parameters for use in controlling at least some aspects of the operation of circuitry 660, as well as (via control of PLC 666) whether circuitry 660 is used or bypassed and therefore not used. As has already been said, channel align circuitry 660 is typically not used in POS-5 mode, because in that mode the channel alignment function can be performed as part of the byte synchronization operation.

Figure 13A:
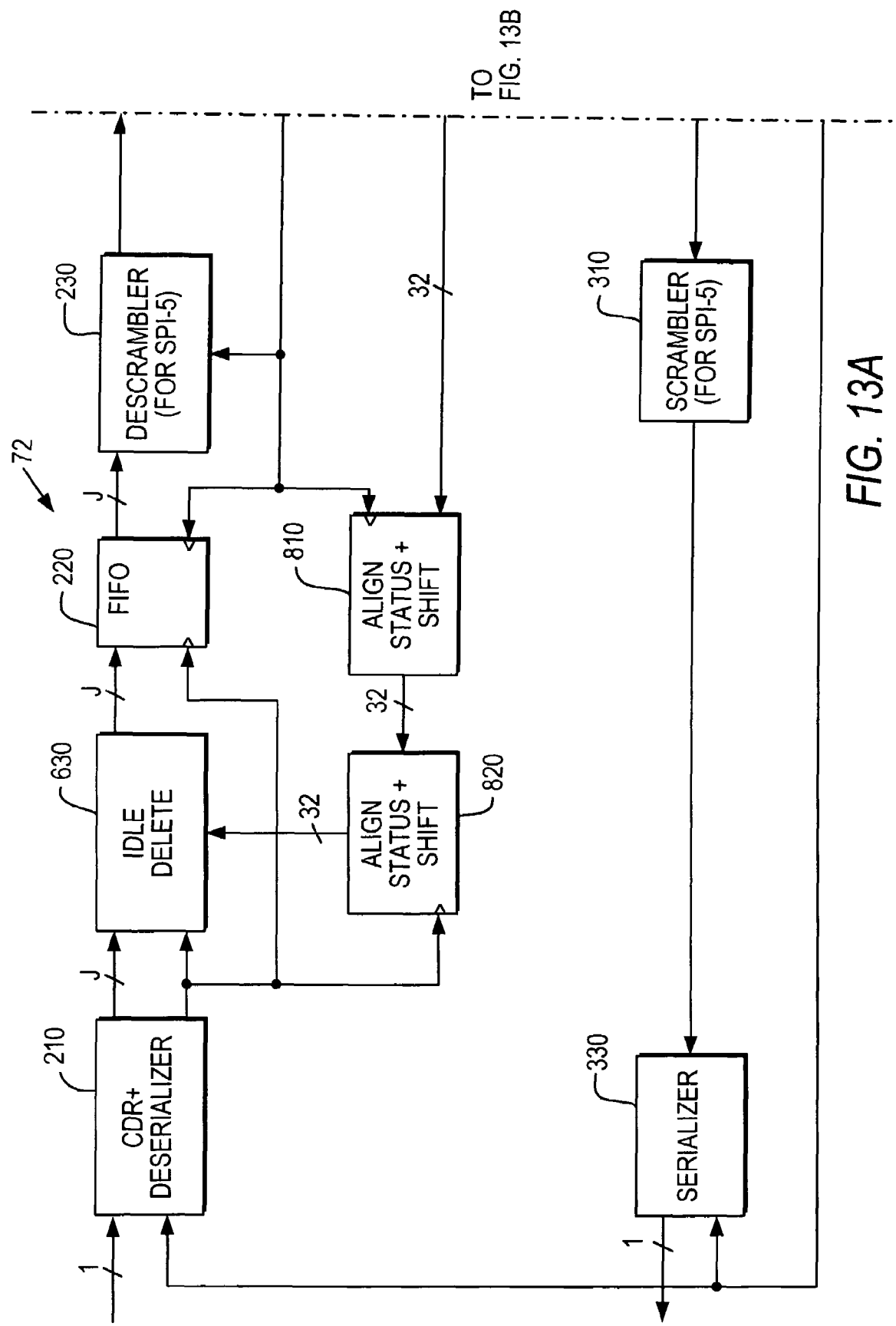
FIGS. 13A and 13B are collectively an alternative illustrative embodiment of circuitry of the type shown in FIGS. 10A and 10B in accordance with the invention.
Figure 13B:
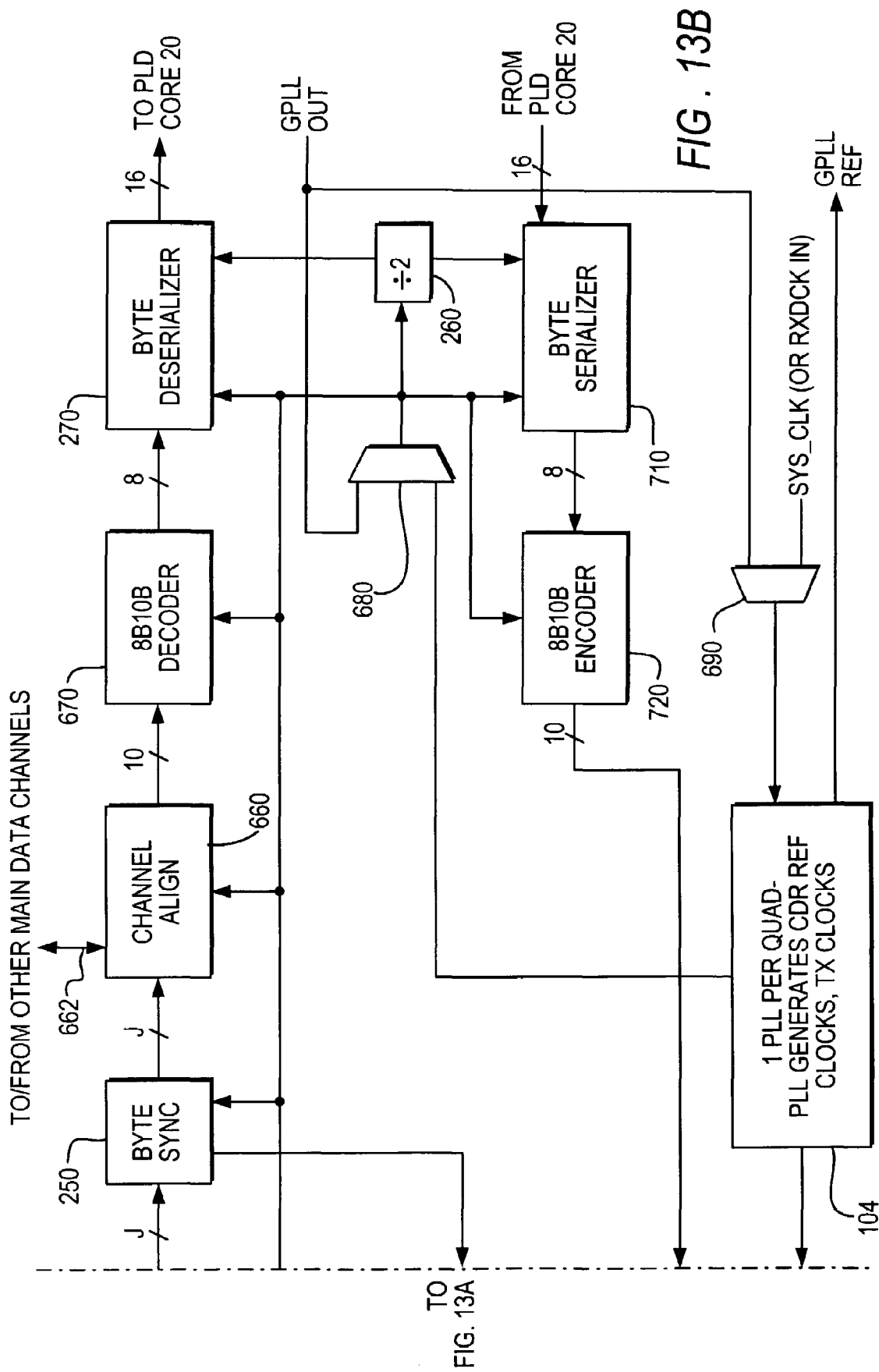

FIGS. 13A and 13B show another, alternative, illustrative embodiment of circuitry in accordance with this invention with capabilities like the circuitry shown, for example, in FIGS. 10A and 10B. Elements in FIGS. 13A and 13B that are the same as or similar to elements in FIGS. 10A and 10B have the same reference numbers in both sets of FIGS. As in FIGS. 10A and 10B, circuitry of the general type shown in FIG. 11 can be provided in FIGS. 13A and 13B for any functional block that it may be desired to bypass in order to configure the circuitry to support various communication protocols. Indeed, in FIGS. 13A and 13B all or substantially all functional blocks are preferably individually bypassable using circuitry of the type shown in FIG. 11.

One of the possible advantages of the alternative architecture shown in FIGS. 13A and 13B is that it tends to make it easier to implement a state machine for byte synchronization in PLD core 20 if that is desired. Particularly helpful in this regard is the placement of byte synchronization circuitry 250 after FIFO circuitry 220. In FIGS. 13A and 13B, byte synchronization circuitry 250 is fixed before channel align circuitry 660. Idle delete circuitry 630 is enabled after byte synchronization is achieved as determined by the state machine associated with byte synchronization circuitry 250. In connection with this, align status and shift signals are registered and transferred from the local clock domain to the recovered clock domain by elements 810 (local clock side) and 820 (recovered clock side). In this signalling, five bits of control information are encoded as 32 bits, of which only one changes at any one time in order to avoid indeterminate states in asynchronous signals.

Figure 14:
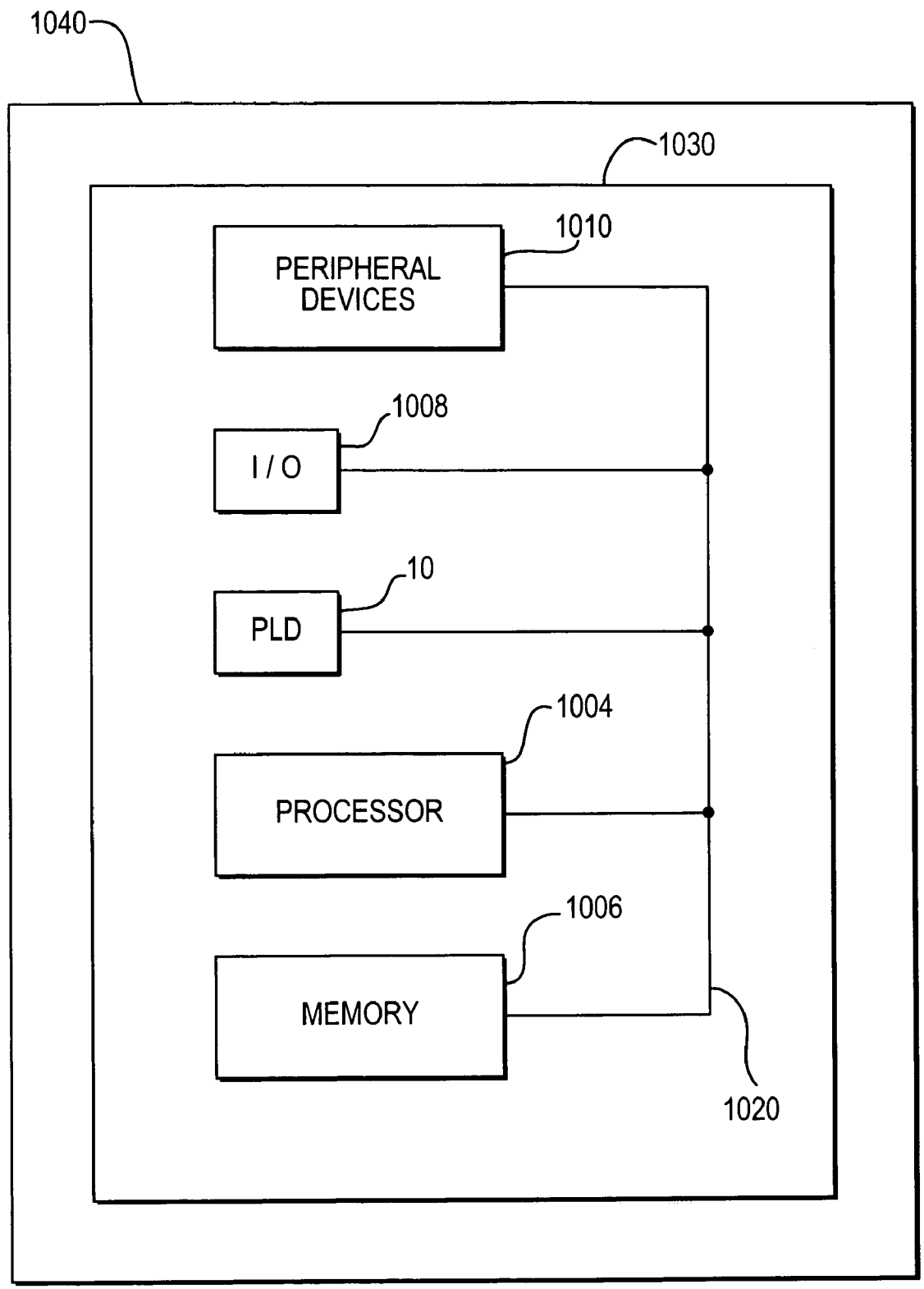
FIG. 14 is a simplified schematic block diagram of an illustrative system employing circuitry in accordance with the invention.

FIG. 14 illustrates a PLD 10 of this invention in a data processing system 1002. Data processing system 1002 may include one or more of the following components: a processor 1004; memory 1006; I/O circuitry 1008; and peripheral devices 1010. These components are coupled together by a system bus or other interconnections 1020 and are populated on a circuit board 1030 that is contained in an end-user system 1040. Any of the interconnections between PLD 10 and any other elements may be made using the above-described communication protocols.

System 1002 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 1004. PLD 10 may also be used as an arbiter for arbitrating access to a shared resource in system 1002. In yet another example, PLD 10 can be configured as an interface between processor 1004 and one of the other components in system 1002. It should be noted that system 1002 is only exemplary, and that the true scope and spirit of the invention should be indicated by the following claims.

Various technologies can be used to implement PLDs having the features of this invention, as well as the various components of those devices (e.g., the above-described PLCs and programmable function control elements ("FCEs") that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. PLCs and other circuit components can be controlled by various, programmable, function control elements ("FCEs"). (With certain implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art, without departing from the scope and spirit of the invention. For example, the order of the various operating components shown and described above is, at least in some respects, only illustrative. Thus the order of at least some of these elements can be changed from the order shown, if that is desired. As another example of possible modifications, the numbers of the various types of circuits and circuit components can be varied as desired.

What is claimed is:

1. A programmable logic integrated circuit device comprising:
   programmable logic circuitry; and
   high speed serial interface circuitry including a plurality of functional subcircuits, each of which is at least partly hard-wired to perform a respective function that may be needed to provide a high speed serial interface, and routing circuitry adapted to allow at least one of the functional subcircuits to be selectively bypassed, at least one of the functional subcircuits being selected from the group consisting of scrambling circuitry and descrambling circuitry.

2. The devices defined in claim 1 wherein at least one of the functional subcircuits is at least partly controllable to vary a function performed by that functional subcircuit.

3. The device defined in claim 2 further comprising:
   programmable circuitry by which the function performed by the at least one functional subcircuit can be programmably controlled.

4. The device defined in claim 2 further comprising:
   dynamic signal source circuitry by which the function performed by the at least one functional subcircuit can be dynamically controlled.

5. The device defined in claim 1 further comprising:
   programmable circuitry by which at least some routing effected by the routing circuitry can be programmably controlled.

6. The device defined in claim 1 further comprising:
   dynamic signal source circuitry by which at least some routing effected by the routing circuitry can be dynamically controlled.

7. The device defined in claim 1 wherein routing selectable by the routing circuitry includes applying a signal that is bypassing one of the functional subcircuits to another of the functional subcircuits.

8. The device defined in claim 1 wherein routing selectable by the routing circuitry includes applying a signal that is bypassing a functional subcircuit to the programmable logic circuitry.

9. The device defined in claim 1 further comprising memory circuitry coupled to the scrambling circuitry, wherein the memory circuitry is configured to store scrambling parameters and scrambling algorithms.

10. The device defined in claim 1 further comprising memory circuitry coupled to the descrambling circuitry, wherein the memory circuitry is configured to store descrambling parameters and descrambling algorithms.

* * * * *